March 16, 1965 D. S. BEYER ETAL 3,173,816

METHOD FOR FABRICATING ALLOYED JUNCTION SEMICONDUCTOR ASSEMBLIES

Filed Aug. 4, 1961 3 Sheets-Sheet 1

INVENTORS
Donald S. Beyer
Charles G. Thornton
BY
Mueller & Aichele
ATT'YS.

March 16, 1965 D. S. BEYER ET AL 3,173,816

METHOD FOR FABRICATING ALLOYED JUNCTION SEMICONDUCTOR ASSEMBLIES

Filed Aug. 4, 1961 3 Sheets-Sheet 2

INVENTORS
Donald S. Beyer
Charles G. Thornton

BY Mueller & Aichele

ATT'YS.

INVENTORS
Donald S. Beyer
Charles G. Thornton
BY
Mueller & Aichele
ATT'YS.

United States Patent Office 3,173,816

Patented Mar. 16, 1965

3,173,816

METHOD FOR FABRICATING ALLOYED JUNCTION SEMICONDUCTOR ASSEMBLIES

Donald S. Beyer, Scottsdale, and Charles G. Thornton, Phoenix, Ariz., assignors to Motorola, Inc., Chicago, Ill., a corporation of Illinois Filed Aug. 4, 1961, Ser. No. 129,381
3 Claims. (Cl. 148—177)

This invention relates generally to the semiconductor art and to methods and apparatus for making alloyed connections in semiconductor products. In particular, the invention relates to an improved method and apparatus for forming alloyed junctions of very shallow penetration in semiconductor crystal elements, which consistently produce junctions and associated electrodes that are relatively free of imperfections compared to those produced by known alloying methods.

In the manufacturue of semiconductor devices such as transistors and rectifiers, alloying methods are often employed to form one or more junctions in a semiconductor crystal element. Such an alloyed junction may be of the rectifying type or of the ohmic type, and in either case it is formed by providing metallic impurity material in contact with a face of a semiconductive crystal element and subjecting this assembly to heat at a temperature above the alloying point so that the materials alloy with each other throughout a region where melting occurs. The junction is at the innermost portion of this alloyed region.

In transistors there are two rectifying junctions, and it is very desirable to have these junctions be parallel to each other and free of irregularities in order to make the current carrying paths between the junctions as uniform in length as possible. This can be accomplished completeely satisfactorily for many applications by alloying impurity material into crystal faces which are known to be parallel to (111) crystallographic planes of the crystal, as described and claimed in United States Patent No. 2,971,869, of William E. Taylor, and assigned to the present assignee.

However, some applications, particularly for transistors which are designed to operate at high frequencies and high high switching speeds, the degree of perfection of the junctions and the associated electrode becomes critical, and there has been a need for improvement of the basic alloying methods. Three specific problems have been encountered in forming extremely shallow alloyed junctions in high frequency transistors:

(1) The alloyed junctions, although generally flat, have not been as free of irregularities as desired.

(2) The outer surface of the alloyed region which forms an electrode has not been as smooth and free of contamination as desired.

(3) In forming junctions of micrometric depth (often less than one micron) it has not been possible to control the penetration of the impurity material into the crystal element completely accurately. Because of this the alloyed region sometime extends through a thin base region in the element, thus producing an electrical short.

These problems, and others which will be discussed herein, can be related to the fact that alloying methods used in the semiconductor art have in general been equilibrium processes in which the alloying temperature has been the predominant controlling factor. The time factor has been relatively unimportant. The work has generally been heated at the alloying temperature long enough, at least a minute and usually longer, that the entire crystal and metal assembly reaches the alloying temperature. When the assembly cools, the temperature at the junction decreases only as heat leaves the assembly, and this happens at a relatively slow rate. This is referred to as cooling from the outside of the crystal, and because cooling occurs only in this manner, the alloying cannot be effectively halted at any particular, selected alloy penetration short of that obtained at equilibrium. Also, imperfections present in the crystal structure of the semiconductor material and oxides existing at the original interface betwen the impurity metal and the semiconductor material tend to produce non-uniform wetting and non-unifrom penetration of the impurity material into the crystal resulting in irregular junctions.

Accordingly, a general object of the invention is to provide an improved method of forming shallow alloyed junctions in semiconductor assemblies which imparts superior characteristics to the alloyed region as compared to prior art methods.

Another object of the invention is to provide an alloying method which produces less irregular junctions in semiconductor material than known methods.

Another object of the invention is to provide an improved alloying method whereby the final depth or penetration of an alloyed region in a semiconductor crystal element can be controlled extremely accurately, and wherein the depth of alloying can be kept extremely shallow.

A further object of the invention is to provide a method of alloying and an apparatus for accomplishing it which are simple and economical and which can be applied to the fabrication of semiconductor products on a mass production basis.

A feature of the invention is the provision of an alloying method for forming semiconductor junctions wherein the time of heating the work to cause alloying is so short that it is a dominant factor in controlling the manner in which alloying takes place. Preferably, the work is subjected to an instantaneous burst of heat to accomplisht alloying and only the "skin" of the semiconductor element is heated to the alloying point. This results in shallow, highly planar junctions whose depth can be accurately controlled, and consequently it is possible to optimize some of the important electrical parameters of the final semiconductor devices.

Another feature of the invention is the provision of alloying apparatus and an alloying method wherein a semiconductor element with metal in contact therwith rapidly slides downward through a heated region in the apparatus and thus traverses that region quickly to produce only "skin heating" of the assembly.

Another feature of the invention is the provision of a high speed alloying method which causes metallic impurity material such as aluminum to wet semiconductor material very uniformly and without irregular puddling of the metal, such that the resulting alloyed electrodes have a smooth exterior surface which makes it possible to bond connecting wires thereto reliably and on a reproducible basis.

The invention is illustrated in the accompanying drawings in which.

The invention will be described as it is applied to the fabrication of high frequency transistors of the type known in the art as Mesa transistors, but it will be clear that the utility of the invention is not limited to this particular application.

In the manufacture of certain germanium Mesa transistors a germanium crystal is grown, and acceptor or donor impurity material is incorporated in the crystal while it is being grown. The germanium crystal is sliced into thin wafers, and the cutting is done in a direction parallel to a (111) plane of the crystal such that the major faces of each wafer are parallel to that plane. When subsequent alloying is performed it is very advantageous to alloy into a wafer face which is parallel to a (111) plane in the wafer as described and claimed in the aforementioned Patent Number 2,971,869 of William E. Taylor. Following the cutting of the wafer it is lapped to make its faces smooth and then polished on one face.

A thin base region is then established at the polished face of the wafer by solid state diffusion methods. This diffused base region is typically approximately one micron thick. Metallic impurity material is then vapor deposited through a mask onto the polished and diffused face of the wafer, and the resulting deposits are often in the form of stripes. Such deposition methods are well known in the semiconductor industry, and a suitable method is described generally in an article by C. H. Knowles entitled New Transistor Design—the Mesa published in the August 1958 issue of Electronic Industries magazine.

Figure 2:
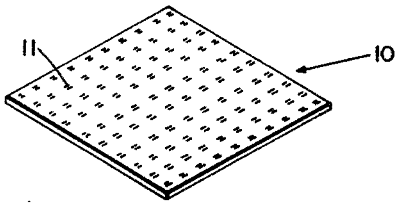
FIG. 2 is an enlarged perspective view of a slab-like semiconductor assembly including a crystal element of semiconductor material which has many pairs of deposits of metallic impurity material on its top surface.

FIG. 2 shows a slab assembly 10 of semiconductor material on which many pairs 11 of metallic stripes have been vapor deposited for the purpose of eventually providing alloyed rectifying and ohmic contacts to the individual die elements. One stripe of each pair is of aluminum, and the other is of a gold-antimony alloy and may also include silver.

Figure 1:
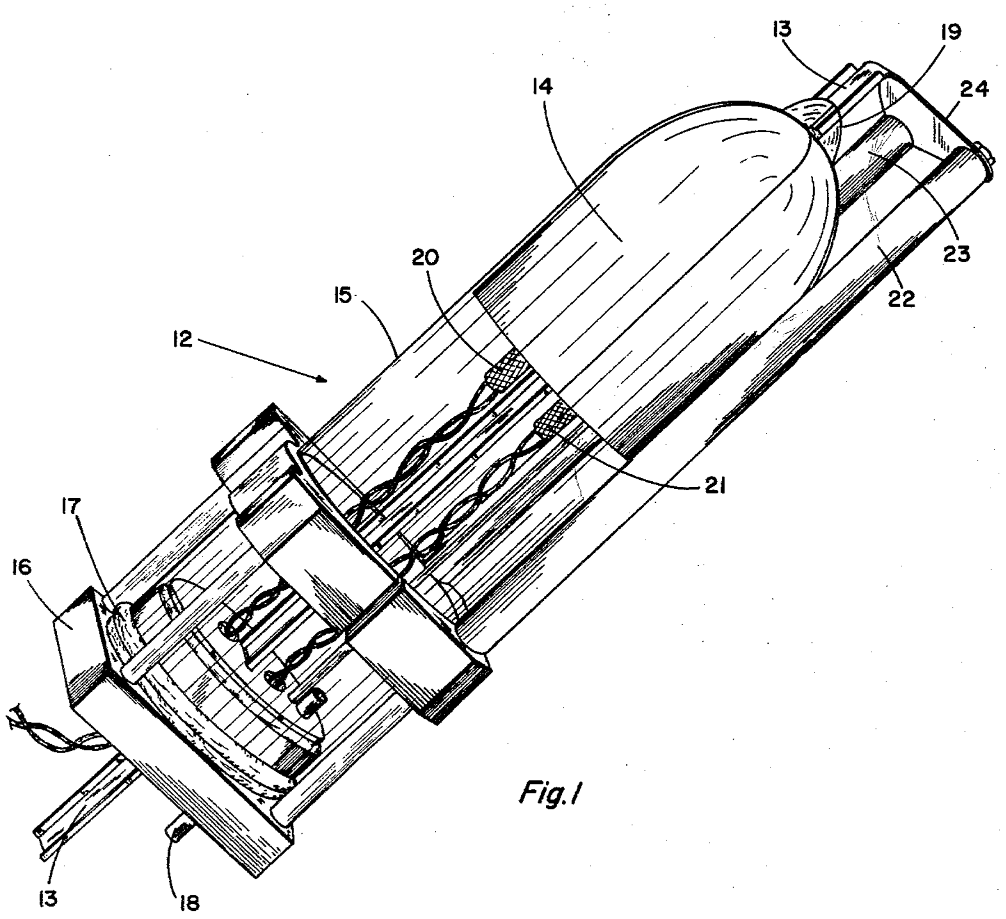
FIG. 1 is a perspective view of alloying apparatus for subjecting a semiconductor assembly to a burst of heat in accordance with the invention.

The metallic stripes 11 on the slab assembly 10 may be alloyed to the substrate semiconductor material in accordance with the invention using the alloying furnace 12 shown in FIG. 1. An inclined chute 13 runs through the entire furnace 12. The slab assembly 10 is placed on the upper end of the chute 13 and is allowed to slide freely down the chute and through a graphite heating block 14. The assembly 10 passes through the heated region in a few tenths of a second, or less and the time that the assembly is in the heated region can be varied by adjusting the slope of the chute with respect to gravity vertical.

All the internal parts of the furnace are enclosed by a quartz tube 15 which is sealed to the left hand end bell 16 by an "O-ring" 17. Forming gas is brought into the quartz tube 15 through the inlet 18. The gas leaves the quartz tube at the orifice 19 at the upper right hand end of the tube 15. The gas maintains the desired atmosphere inside the furnace. The heating block 14 provides the heat source for the alloying, and is heated by two cartridge heaters 20 and 21 which fit snugly into longitudinal holes in the heating block. The rods 22 and 23, the bracket 24 and the end bell 16 support the furnace. The alloying method will be further described but first the description of the over-all manufacturing process will be completed.

Figure 3:
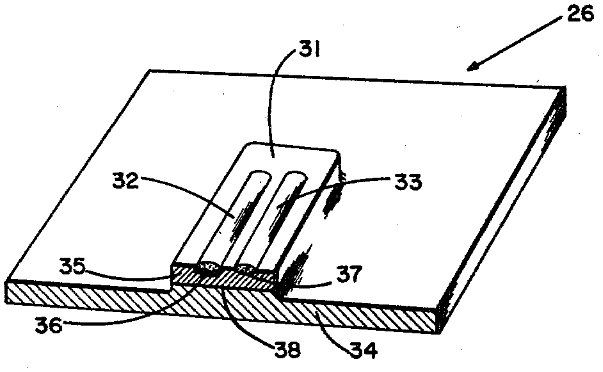
FIG. 3 is a greatly enlarged perspective view of a semiconductor die assembly which has been fabricated from a piece of the slab-like assembly of FIG. 2.

Following the alloying step the slab assembly 10 may be etched using photolithographic techniques to form Mesa-like projections on the slab assembly. Then the wafer is divided into individual die assemblies such as the assembly 26 shown in FIG. 3. A typical die assembly 26 is 25 mils square, and the two stripes 32 and 33 are about 1 mil wide. It can be seen in FIG. 3 that the upper surface of the die has been etched away except at a Mesa-like region 31 at the center of the die. The stripes 32 and 33 are located on the Mesa-like region.

In this particular die assembly, there is a "P" type collector region 34 and a very thin "N" type base region 35. Stripe 32 is of aluminum alloyed with germanium. Since the aluminum is an acceptor type impurity material, it forms a rectifying junction 36 with the "N" type base region 35. Stripe 33 is of gold, antimony and silver alloyed with germanium and forms an ohmic junction 37 with the base region 35. The portion of the stripe 32 on the surface of the die is the emitter electrode of the assembly, and similarly the surface portion of the stripe 33 is the base electrode. The collector junction is at 38.

Figure 4:
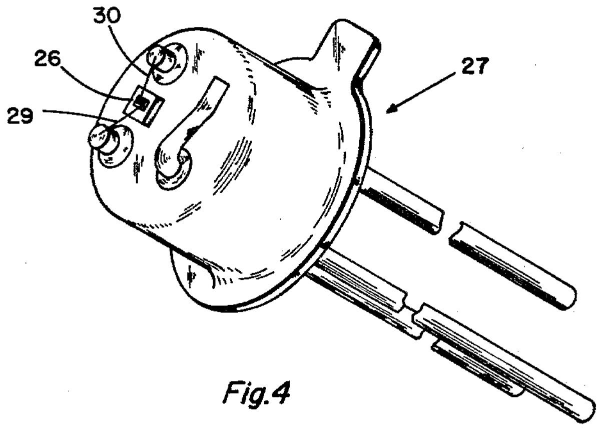
FIG. 4 is an enlarged perspective view of a semiconductor transistor device which includes the die assembly shown in FIG. 3.

The die 26 is assembled into a transistor header subassembly 27 such as the one shown in FIG. 4. The die 26 is soldered directly to the body of the subassembly 27 and tiny gold wires 29 and 30 provide the electrical connections to the stripes on the die. These wires are bonded to the stripes by thermocompression bonding techniques, and it is very desirable to have smooth, uncontaminated surfaces on the stripes in order to obtain acceptable bonds.

It is extremely important that the alloyed junctions 36 and 37 formed in the base region 35 (FIG. 3) by the alloyed stripes be shallow and highly planar and have a known and controlled penetration into the base region. The ability to form such an alloyed junction, particularly in the case of the aluminum emitter junction 36, prevents "punch through" or shorting between the collector and emitter regions, improves emitter efficiency, and permits major improvement in the attainment of higher emitter to base breakdown voltages. The apparatus and method of the invention provides a simple, direct way of forming alloyed junctions having these improved properties.

Equilibrium alloying, as differentiated from the dynamic alloying method of the invention, involves heating and cooling of the materials to be alloyed at relatively slow rates under equilibrium conditions. In equilibrium alloying the materials are held at the maximum temperature for a relatively long time such as times of more than one minute. The materials are heated throughout to a certain constant maximum temperature.

By way of contrast, in alloying in accordance with the method of the invention, the materials are subjected to an instantaneous burst of heat. The heat advances into the materials from the surface and produces a steep temperature gradient in the crystal element at its surface. Since the materials pass through the heated zone of the furnace 12 in a few tenths of a second or less, the heating and cooling phenomena are not in accordance with the usual equilibrium conditions that prevail during conventional alloying. The interior of the crystal element remains at approximately room temperature.

Figure 5:
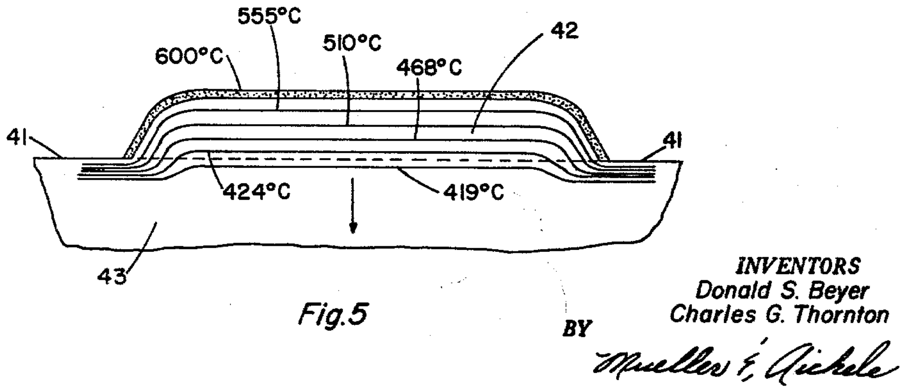
FIG. 5 illustrates schematically on a greatly enlarged scale the temperature gradient which is produced in a semiconductor assembly when it is heated briefly in the apparatus of FIG. 1, and this diagram represents one of the metal deposits and the adjoining semiconductor material of the slab-like assembly of FIG. 2.

FIG. 5 portrays the approximate situation which exists within the materials during alloying in accordance with the invention. The surface labeled 41 is the surface of a semiconductor crystal element 43 which represents the slab 10 of FIG. 2. The region 42 above the surface 41 is metallic impurity material corresponding to one of the aluminum stripes 32.

When a slab assembly 10 (see FIG. 2) is allowed to slide through the furnace 12 of FIG. 1, a temperature gradient is produced in the materials approximately as shown in FIG. 5. The temperature in the heated region of the furnace is 600° C. in this example. The material nearest to the surface of the slab assembly will be hotter than material further into the bulk of the assembly as shown by the isotherms in FIG. 5. Melting will start first at points where the aluminum and germanium are initially in contact and when the temperature at these points reaches 424° C., which is the eutectic temperature for these materials. The eutectic temperature is referred to herein as the alloying point. As soon as some material is melted at the aluminum-germanium interface, melting will then proceed rapidly in each direction normal to that interface.

The precise manner in which alloying proceeds once it has started is not understood in complete detail at the present time. However, it is known that the penetration of the aluminum impurity material into the germanium crystal element is influenced strongly by the temperature gradient produced in the materials as shown schematically in FIG. 5. The particular isotherm which represents the eutectic temperature is the one labeled 424° C. in FIG. 5.

The distribution of isotherms in FIG. 5 represents a condition of the materials before melting starts. As heat advances into the materials, the 424° C. isotherm will, at a certain time, pass the aluminum-germanium interface 41, and thus the materials will have melted all along this isotherm. The interface between the molten material and the crystal material will be referred to hereafter as the liquid-solid interface. This liquid-solid interface has a strong tendency to follow and conform to the 424° C. isotherm. As that isotherm advances into the crystal in the direction indicated by the arrow in FIG. 5, the liquid-solid interface advances with it. This isotherm is substantially planar, at least after it enters the crystal material, due to the relatively low thermal conductivity of the semiconductor material, and this helps to make the liquid-solid interface planar and relatively free of irregularities.

When the materials emerge from the furnace 12, they cool very rapidly. At the time cooling starts, the molten material has reached its maximum penetration into the crystal material, and the junction is formed at this particular depth. When the materials start to cool, it may be noted that the interior of the crystal element is at a much lower temperature than its surface. The center of the element is probably at or near room temperature, and only a skin-like region of the crystal at its surface has been heated to temperatures above the alloying point. Because of this, cooling initially takes place from the interior of the crystal; that is, heat is initially transferred from the surface of the crystal to its interior. This means that the alloyed region cools to a temperature below the alloying point extremely rapidly and consequently the position of the junction is determined or fixed at the time cooling starts. Since only a skin-like region of the crystal element reaches the alloying point, the method of the invention is sometimes called skin alloying, or the "dermalloy" method.

It may be seen that the depth of alloying can be controlled very accurately and limited to very shallow depths. It is possible to form the junction at a selected depth less than that obtained in equilibrium alloying if the heating time is short enough. This makes it possible to control the distance between the emitter and collector junctions 36 and 38 (FIG. 3), and thus optimize certain device parameters such as emitter-to-base breakdown voltage and emitter efficiency.

Because the liquid-solid interface tends to follow the 424° C. isotherm as it advances into the crystal, the resulting alloyed junction is less irregular than shallow junctions obtained in equilibruim alloying. It is believed that the influence of the temperature gradient is strong enough to predominate over the other factors which tend to make the junction irregular. Specifically, at imperfections in the crystal structure, alloying can proceed faster than at places where there are no imperfections, and the temperature gradient seems to counteract this tendency. In equilibrium alloying, oxides at the aluminum-germanium interface appreciably interfere with good general wetting and this is an important contributing factor toward the formation of irregular junctions and shorting between emitter and collector regions. The skin alloying method provides a good general wetting which greatly reduces the junction irregularity and shorting problems.

Figure 6A:
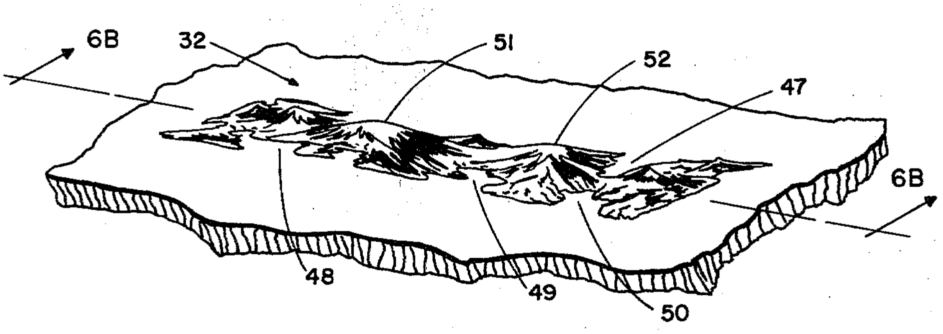
FIG. 6A is a view enlarged many many times over actual size of a metallic electrode which has been alloyed to semiconductor material under equilibrium conditions.
Figure 6B:
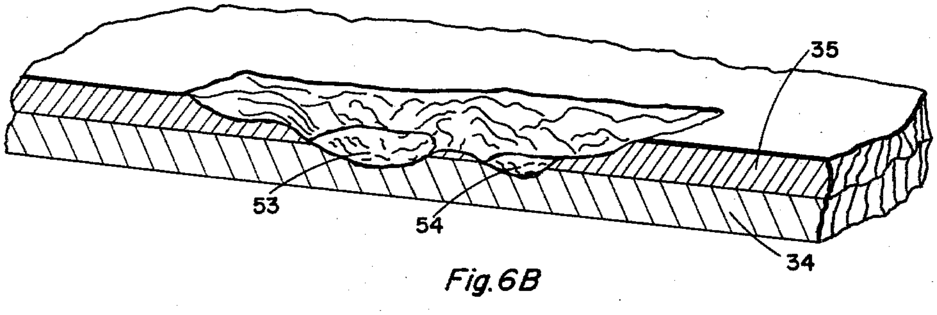
FIG. 6B is a sectional view taken along line 6B—6B of FIG. 6A and shows the junction region within the semiconductor material after all the alloyed electrode material has been removed by etching.

FIGS. 6A, 6B, 7A and 7B permit a graphic comparison to be made between the results of an equilibrium alloying method of the prior art and the skin alloying method of the invention. FIGS. 6A and 6B show the condition of an aluminum electrode or stripe 32 and an alloyed junction respectively for the equilibrium method. Due to poor wetting the aluminum has not wet the germanium surface uniformly and areas such as 47, 48, 49 and 50 have not been wet at all. At points 51 and 52 good wetting has occurred but the aluminum material at these points has built up abnormally to form peaks. The poor wetting thus causes a very rough and inconsistent electrode surface which complicates attempts to make satisfactory electrical lead attachments. An even more serious result of the uneven wetting is the tendency for the aluminum to alloy very deeply under points where a peak occurs. This deep alloying often causes the junction to alloy though the base region 35 thus causing an emitter-to-collector short which makes the transistor inoperative. Points 53 and 54 which underlie peaks 51 and 52 have alloyed through the base region 35 and into the collector region 34 thus making the transistor defective. As mentioned above, another contributing factor toward the irregularity of the junction in equilibrium alloying is the tendency for alloying to proceed faster at imperfection sites within the semiconductor material.

Figure 7A:
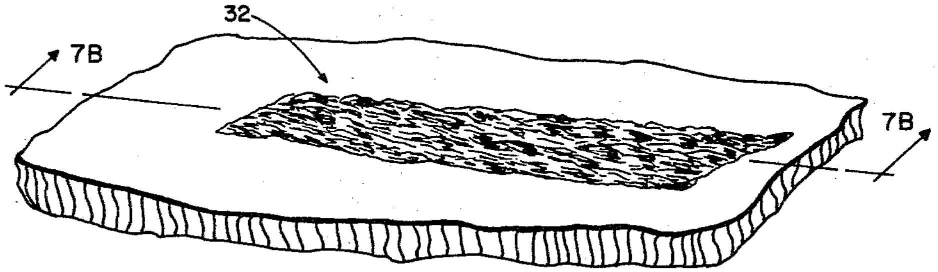
FIG. 7A is a similarly enlarged view of a metallic electrode which has been alloyed to the semiconductor material using the method of the invention.
Figure 7B:
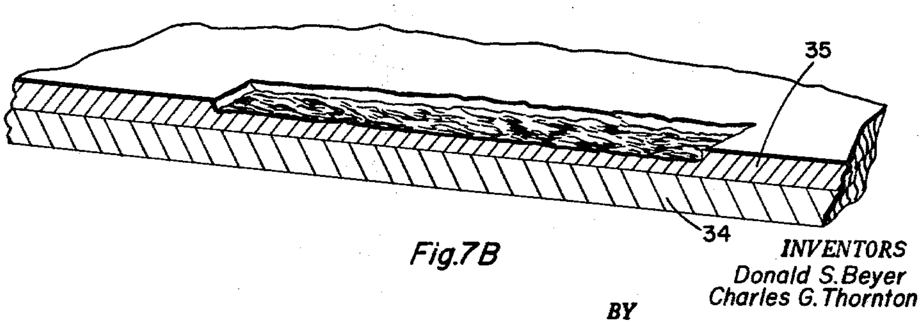
FIG. 7B is a sectional view taken along line 7B—7B of FIG. 7A and shows the junction region within the semiconductor material after all the alloyed electrode material has been removed by etching.

The skin alloying method of the invention produces highly improved surface conditions of the aluminum electrode or stripe. FIG. 7A shows an aluminum stripe which has been skin alloyed and it has a comparatively smooth aluminum surface. There are no areas where the aluminum has built up abnormally and there are no regions of alloying through the base region (see FIG. 7B). Also, because of the planar melting of the germanium that is characteristic of the skin alloying process, the junction is not irregular. Thus, the skin alloying method provides smooth electrode surfaces and unusually planar junctions which are comparatively free of irregularities. Additionally, because the melting of the germanium can be precisely controlled, the junction can be placed accurately at a desirable depth within the base region.

Although the invention has been described in connection with aluminum and gold alloyed with germanium, similar advantageous properties of the junction and electrode are obtainable when aluminum is alloyed to silicon and when other combinations of impurity material and semiconductor material are alloyed by the skin alloying method.

Thus, it is apparent that the alloying method of the invention permits the attainment of alloyed electrodes and junctions which possess unusually useful and superior characteristics.

We claim:

1. A method of providing an alloy junction in a semiconductor unit, which unit comprises a semiconductor element having an impurity layer thereon, and with said semiconductor unit having an alloying temperature at which the impurity layer alloys with the semiconductor element, said method including the dropping of said semiconductor unit in a guided path from a room temperature region into and through a heated region which is maintained at a temperature above the alloying temperature of the semiconductor unit and out from said heated region into a room temperature region again, said semiconductor unit passing quickly through said heated region, with the quickness of said passing movement being at a time such that the heating of the semiconductor unit to an alloying temperature to form the alloy junction is limited substantially to the material at the interface of the impurity layer and the semiconductor element, said alloy junction being formed during said time.

2. A method of providing an alloy junction at each of a plurality of impurity layers in a semiconductor assembly wherein the assembly comprises a semiconductor wafer having the plurality of impurity layers on one surface thereof and separated from one another on that surface, with said semiconductor assembly having an alloying point at which each impurity layer alloys with the semiconductor wafer, said method including the dropping of a semiconductor assembly in a guided path from a room temperature region into and through a heated region which is maintained at a temperature above the alloying point of the semiconductor assembly and out from said heated region into a room temperature region again, said semiconductor assembly passing quickly through said heated region, with the quickness of said passing movement being at a time interval such that the heating of the semiconductor assembly to an alloying point to form each alloy junction is limited substantially to the material at the interface of each impurity layer and the semiconductor wafer, each said alloy junction being formed during said time interval.

3. A method of providing an alloy junction in a semiconductor unit, which unit comprises a semiconductor element having an impurity layer thereon, and with said semiconductor unit having an alloying point at which the impurity layer alloys with the semiconductor element, said method including the dropping of a semiconductor unit in a guided path from a room temperature region into and through a heated region which is maintained at a temperature above the alloying point of the semiconductor unit and out from said heated region into a room temperature region again, said semiconductor unit passing through said heated region in a time interval of less than a few tenths of a second, such time interval permitting the heating of the semiconductor unit to an alloying point only at the material substantially at the interface of the impurity layer and the semiconductor element, with an alloy junction at said material being formed during said time interval.

References Cited by the Examiner

UNITED STATES PATENTS

| | | | |
|---|---|---|---|
| 1,406,424 | 2/22 | Sorenson | 266—5 |
| 2,671,156 | 3/54 | Douglas et al. | 148—1.5 |
| 2,845,260 | 7/58 | Rusciano | 266—5 |
| 2,916,408 | 12/59 | Freedman | 148—1.5 |
| 2,956,913 | 10/60 | Mack et al. | 148—1.5 |
| 3,021,412 | 2/62 | Whitman et al. | 266—5 X |
| 3,027,501 | 3/62 | Pearson | 148—1.5 X |

FOREIGN PATENTS

| | | |
|---|---|---|
| 742,238 | 12/55 | Great Britain. |
| 816,170 | 7/59 | Great Britain. |
| 844,747 | 8/60 | Great Britain. |

OTHER REFERENCES

IBM Technical Disclosure Bulletin, vol. 1, No. 5, February 1959, page 16.

DAVID L. RECK, *Primary Examiner.*

RAY K. WINDHAM, *Examiner.*